(12) United States Patent
Park

(10) Patent No.: US 8,154,083 B2
(45) Date of Patent: Apr. 10, 2012

(54) SEMICONDUCTOR DEVICE FORMED ON HIGH-RESISTANCE SUBSTRATE

(75) Inventor: Young Jin Park, Yuseong-Gu (KR)

(73) Assignee: Petari Incorporation (KR)

( * ) Notice: Subject to any disclaimer, the term of this patent is extended or adjusted under 35 U.S.C. 154(b) by 0 days.

(21) Appl. No.: 13/010,786

(22) Filed: Jan. 21, 2011

(65) Prior Publication Data

US 2011/0175194 A1    Jul. 21, 2011

Related U.S. Application Data

(63) Continuation of application No. 12/171,306, filed on Jul. 11, 2008, now abandoned.

(30) Foreign Application Priority Data

Jul. 13, 2007    (KR) .................. 10-2007-0070527

(51) Int. Cl.
*H01L 21/331*    (2006.01)
(52) U.S. Cl. ........ 257/356; 257/194; 257/313; 257/506; 257/E27.013
(58) Field of Classification Search .......... 257/192–194, 257/312–313, 506, 595, 356
See application file for complete search history.

(56) References Cited

U.S. PATENT DOCUMENTS

| | | | |
|---|---|---|---|
| 6,414,373 B2 | 7/2002 | Yamada et al. | |
| 6,943,428 B2 | 9/2005 | Furukawa et al. | |
| 6,949,440 B2 | 9/2005 | Gau | |
| 2006/0163609 A1 | 7/2006 | Asano et al. | |
| 2006/0163669 A1* | 7/2006 | Youn et al. ..................... | 257/384 |

FOREIGN PATENT DOCUMENTS

| | | |
|---|---|---|
| JP | 2003124332 | 4/2003 |
| KR | 10-1999-0033433 | 5/1999 |
| KR | 1020040084728 | 10/2004 |
| KR | 1020050013190 | 2/2005 |
| KR | 1020060035975 | 4/2006 |

* cited by examiner

*Primary Examiner* — Dung A. Le
(74) *Attorney, Agent, or Firm* — Horizon IP Pte Ltd

(57) ABSTRACT

The present invention relates to a semiconductor device and a method of manufacturing the same. A high-resistance silicon wafer is manufactured in such a manner that a large-sized silicon wafer manufactured by the Czochralski method is irradiated with neutrons, and high-resistance and low-resistance elements are simultaneously formed on the high-resistance silicon wafer. Thus, the manufacturing cost can be remarkably saved, and the reliability of products can be enhanced.

21 Claims, 4 Drawing Sheets

SEMICONDUCTOR DEVICE FORMED ON HIGH-RESISTANCE SUBSTRATE

CROSS REFERENCE TO RELATED APPLICATION

This application is a Continuation application which claims benefit of co-pending U.S. patent application Ser. No. 12/171,306 filed Jul. 11, 2008 and entitled "Semiconductor Device And Method Of Manufacturing The Same", which claims priority to Korean Patent application No. 10-2007-0070527, filed on Jul. 13, 2007 and all the benefits accruing therefrom under 35 U.S.C. 119, the contents of which are herein incorporated by reference in their entirety.

BACKGROUND

In a micro inductor used for a radio frequency integrated passive device (hereinafter, referred to as an "RFIPD"), an isolator, a transformer or the like, a thick dielectric or high-resistance layer having a thickness of 20 μm or more should be formed in a lower portion of the micro inductor so as to improve the quality factor (Q-factor) by decreasing insertion loss. However, since a dielectric layer has a restriction in dissipating heat generated from an inductor due to low thermal conductivity, it is difficult to manufacture a high-performance inductor. Thus, a material with excellent thermal conductivity should be formed in a lower portion of an inductor. When a material having low resistance is formed in the lower portion of the inductor, a large number of free electrons and holes that exist inside the corresponding material decrease the magnetic field strength of the inductor. Therefore, the insertion loss of the inductor is increased, and consequently, the Q-factor is decreased. However, when a high-resistance layer of 5 kΩ-cm or more is formed in the lower portion of the inductor, it is possible to use a material with relatively excellent thermal conductivity depending on the kind of material of the high-resistance layer, and a satisfactory Q-factor can be obtained because the insertion loss of the inductor is small.

A material having excellent thermal conductivity and high resistance includes III-V Group semiconductors (GaAs has a thermal conductivity of 0.46 W/cm-° C., and GaN has a thermal conductivity of 1.1 W/cm-° C.). However, there is a disadvantage in that these semiconductors are considerably expensive. On the other hand, silicon semiconductors have a considerably excellent thermal conductivity (1.31 W/cm-° C.), and the low manufacturing cost.

However, although a silicon wafer manufactured by the Czochralski method, which is generally used, has the low manufacturing cost, an oxygen component flows out from a quartz growth container when growing silicon crystals and the oxygen component serves as an n-type impurity, which makes it difficult to manufacture a high-resistance silicon wafer. Thus, it is general that an n-type or p-type silicon wafer is manufactured by adding phosphorous (P) or boron (B) to the silicon wafer manufactured by the Czochralski method. Meanwhile, in a case where a silicon wafer is manufactured by a float-zone method, a high-resistance silicon wafer can be easily manufactured because an oxygen component does not flow out from a growth container. However, there are disadvantages in that the silicon wafer manufactured by the float-zone method is higher in manufacturing cost than that manufactured by the Czochralski method, and it is difficult to manufacture a large-sized silicon wafer.

In addition, when an RFIPD, isolator or transformer is manufactured as described above, in order to improve the Q-factor, a thick dielectric layer having a thickness of 20 μm or more is formed, or a high-resistance wafer is used. Therefore, it is impossible to form an element such as a transistor manufactured on a low-resistance wafer simultaneously with the RFIPD, isolator or transformer. This is because when forming a dielectric layer having a thickness of 20 μm or more, it is difficult to perform a process of forming a dielectric layer and impossible to secure a uniform dielectric layer, and it is hardly possible to form electrode wires over a thick dielectric layer even though an element such as a transistor is formed on a low-resistance wafer.

SUMMARY

The present invention provides a semiconductor device having high-resistance and low-resistance elements simultaneously formed on a high-resistance wafer, and a method of manufacturing the same.

The present invention also provides a semiconductor device and a method of manufacturing the same, wherein a high-resistance silicon wafer is manufactured by irradiating a large-sized silicon wafer manufactured by the Czochralski method with neutrons, and high-resistance and low-resistance elements are simultaneously formed on the high-resistance silicon wafer.

According to an aspect of the present invention, there is provided a semiconductor device, which includes a high-resistance silicon wafer; and high-resistance and low-resistance elements formed in one and the other regions of the high-resistance silicon wafer.

The low-resistance element may be formed on an impurity ion implanted region formed in the one region of the high-resistance silicon wafer.

According to another aspect of the present invention, there is provided a semiconductor, which includes a high-resistance silicon wafer; an impurity ion implanted region formed in one region of the high-resistance silicon wafer; a low-resistance element formed on the impurity ion implanted region; a metal wire connected to the low-resistance element through an interlayer dielectric layer and formed on the interlayer dielectric layer; and a high-resistance element connected to a predetermined region of the metal wire.

The high-resistance silicon wafer may be manufactured in such a manner that a silicon wafer manufactured by a Czochralski method is irradiated with neutrons.

The high-resistance silicon wafer may have a resistance of 10 kΩ-cm or more.

The resistance of the high-resistance silicon wafer may be adjusted according to the amount and irradiation time of neutrons.

The low-resistance element may include a transistor, a resistor, a capacitor or a diode or a combination thereof.

The high-resistance element may include a radio frequency integrated passive device (RFIPD), an isolator, a transformer, a filter, a diplexer, a balance to unbalance transformer (balun), a coupler or an antenna or a combination thereof.

The semiconductor device may further include an inductor formed between the metal wire and the high-resistance element.

According to a further aspect of the present invention, there is provided a method of manufacturing a semiconductor device, which includes ion-implanting an impurity in a predetermined region of a high-resistance silicon wafer; forming a low-resistance element on the impurity implanted region of the high-resistance silicon wafer; forming a contact hole exposing a predetermined region of the low-resistance element after forming a first interlayer dielectric layer on the entire structure; forming a first wire by forming a conductive layer to fill the contact and then patterning the conductive layer; forming a via hole exposing a predetermined region of the first wire and simultaneously a trench having a predetermined shape by forming a second interlayer dielectric layer on the entire structure and then patterning it; forming an inductor by forming a conductive layer to fill the via hole and the trench; and forming a high-resistance element connected to the inductor.

The high-resistance silicon wafer may be manufactured in such a manner that a silicon ingot manufactured by the Czochralski method is irradiated with neutrons and cut.

The high-resistance silicon wafer may be manufactured in such a manner that a silicon ingot manufactured by the Czochralski method is cut at a predetermined thickness and irradiated with neutrons.

The resistance of the high-resistance silicon wafer may be adjusted according to the amount and irradiation time of neutrons.

The low-resistance element may include a transistor, a resistor, a capacitor or a diode or a combination thereof.

The changing process will be described. Generally, the specific resistivity of a p-type silicon wafer manufactured by the Czochralski method is about 10 Ω-cm, and the concentration of boron doped as a p-type impurity is about $1 \times 10^{12}/cm^3$. If such a silicon wafer is irradiated with neutrons, a silicon (Si) isotope $Si^{30}$ is changed into $Si^{31}$, and then changed into $P^{31}$ through β-decay. Free electrons of the $P^{31}$ produced as above and holes generated from the boron are recombined, so that the p-type silicon wafer is changed into the intrinsic silicon wafer. As a result, a high-resistance silicon wafer 110 having a specific resistivity of 10 kΩ-cm or more can be manufactured from the silicon wafer manufactured by the Czochralski method by which a large-sized single crystalline silicon can be grown with a low manufacturing cost. Here, the specific resistivity can be adjusted by controlling the irradiation density and time of neutrons. For example, the high-resistance silicon wafer 110 having a specific resistivity of 100 kΩ-cm or more can be manufactured by irradiating a silicon wafer having a specific resistivity of 38 Ω-cm with neutrons having a flux of $2\sim3\times10^{13}$ $n/cm^2$·sec for 2 to 10 hours. Table 1 shows the changes in specific resistivity depending on the irradiation time of neutrons. As can be seen in Table 1, the resistance of wafers is increased as the irradiation time of neutrons is increased.

TABLE 1

| Wafer | Radiation time | Measured value (surface resistance (resistance)) (Ω-cm) | | | | Mean resistance (Ω-cm) |
| --- | --- | --- | --- | --- | --- | --- |
| | | #1 | #2 | #3 | #4 | |
| Bare wafer | | 147(10) | 1302(94) | 512(37) | 146(10) | 38 |
| S#1 | 3.4 hours | 178K(129K) | 180K(131K) | 170K(124K) | 181K(132K) | 129K |
| S#2 | 6.6 hours | 160K(116K) | 155K(112K) | 147K(107K) | 146K(106K) | 110K |
| S#3 | 9.0 hours | 176K(128K) | 174K(126K) | 176K(127K) | 175K(127K) | 127K |

Figure 2:
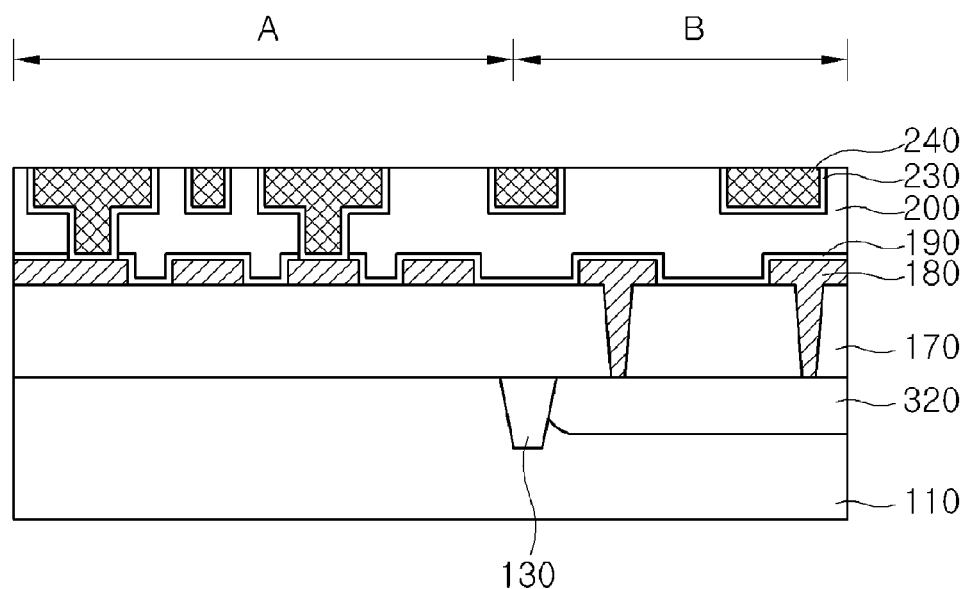
Figure 3:
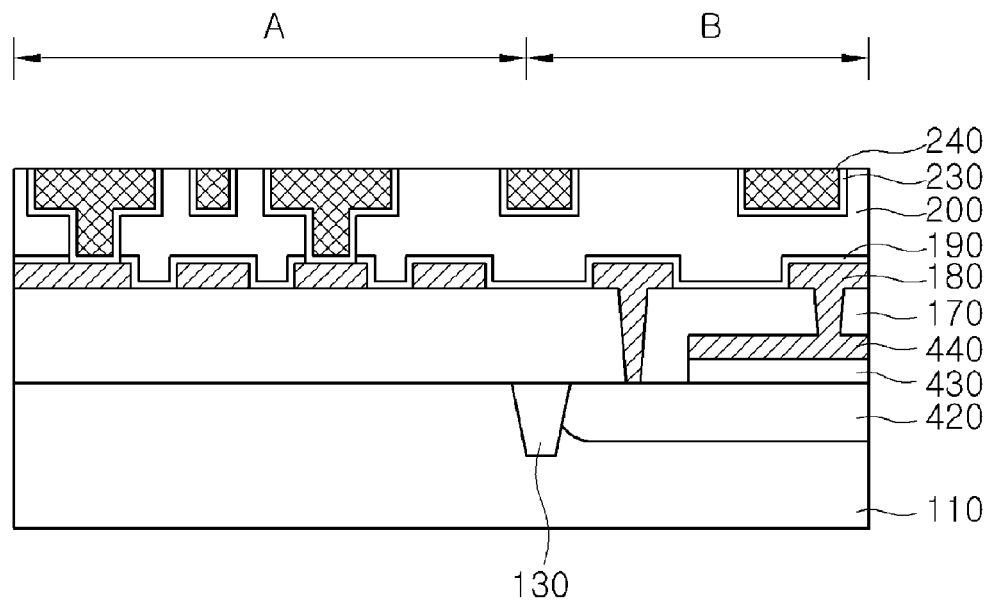
Figure 4:
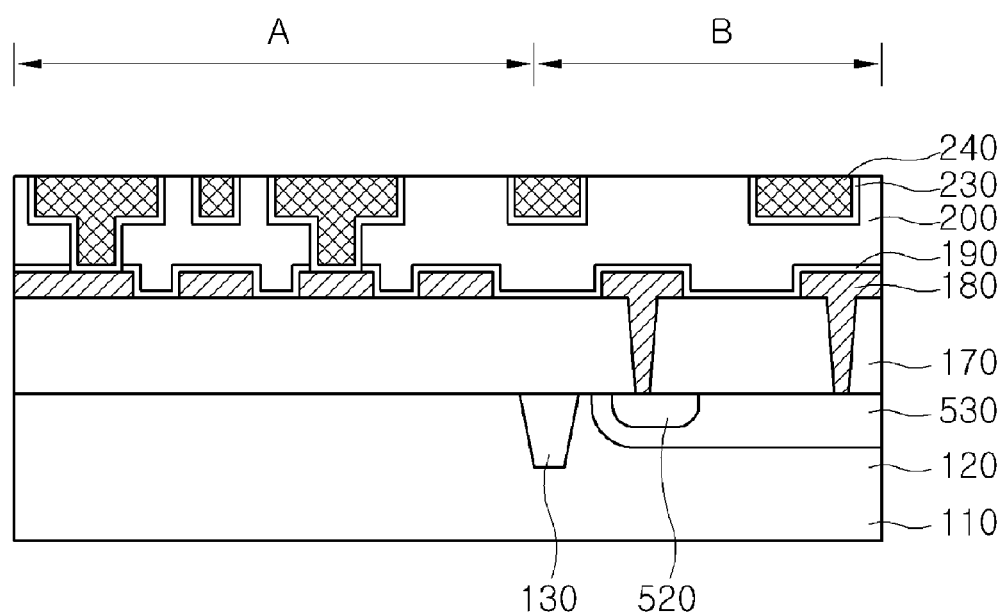

FIG. 2 is a sectional view of a semiconductor device according to a second embodiment of the present invention;

FIG. 3 is a sectional view of a semiconductor device according to a third embodiment of the present invention; and FIG. 4 is a sectional view of a semiconductor device according to a fourth embodiment of the present invention.

DETAILED DESCRIPTION

Hereinafter, exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art.

FIGS. 1a to 1f are sectional views illustrating a method of manufacturing a semiconductor device according to a first embodiment of the present invention. A high-resistance wafer is manufactured in such a manner that a large-sized wafer manufactured by the Czochralski method is irradiated with neutrons, and high-resistance and low-resistance elements are simultaneously formed on the high-resistance wafer so manufactured. Here, it will be described that a transistor is formed as a low-resistance element.

Figure 1A:
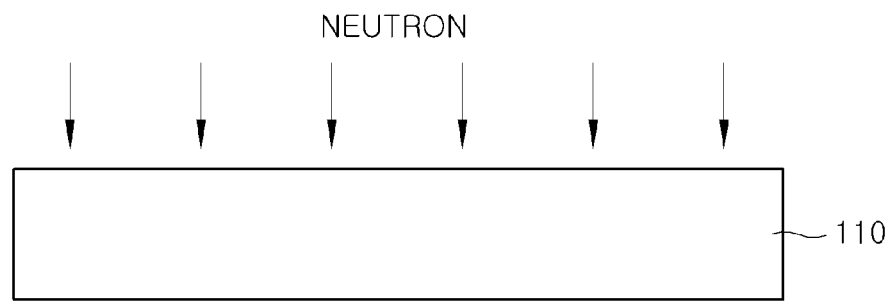
FIGS. 1a to 1f are sectional views sequentially illustrating a method of manufacturing a semiconductor device according to a first embodiment of the present invention.

Referring to FIG. 1a, a p-type silicon wafer manufactured by the Czochralski method is changed into an intrinsic silicon wafer by irradiating the p-type silicon wafer with neutrons.

Meanwhile, the high-resistance silicon wafer 110 may be manufactured in such a manner that a rod-shaped silicon ingot manufactured by the Czochralski method is irradiated with neutrons and then cut at a desired thickness, or in such a manner that a silicon ingot manufactured by the Czochralski method is cut at a desired thickness and then irradiated with neutrons.

Figure 1B:
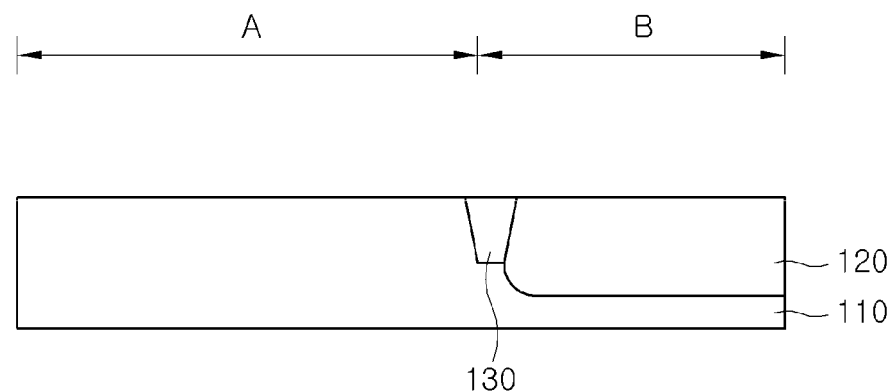

Referring to FIG. 1b, a well region 120 is formed on the high-resistance silicon wafer 110 by ion-implanting a p-type or n-type impurity into a predetermined region of the high-resistance silicon wafer 110. Accordingly, a low-resistance region B, into which the impurity is implanted, and a high-resistance region A, into which the impurity is not implanted, are defined on the high-resistance silicon wafer 110. An isolation layer 130 is formed on the high-resistance silicon wafer 110 between the high-resistance region A and the low-resistance region B, so that the high- and low-resistance regions A and B are electrically isolated from each other. Preferably, the isolation layer 130 is formed in such a manner that the high-resistance silicon wafer 110 is etched at a predetermined depth to form a trench and then the trench is filled with an insulating layer.

Figure 1C:
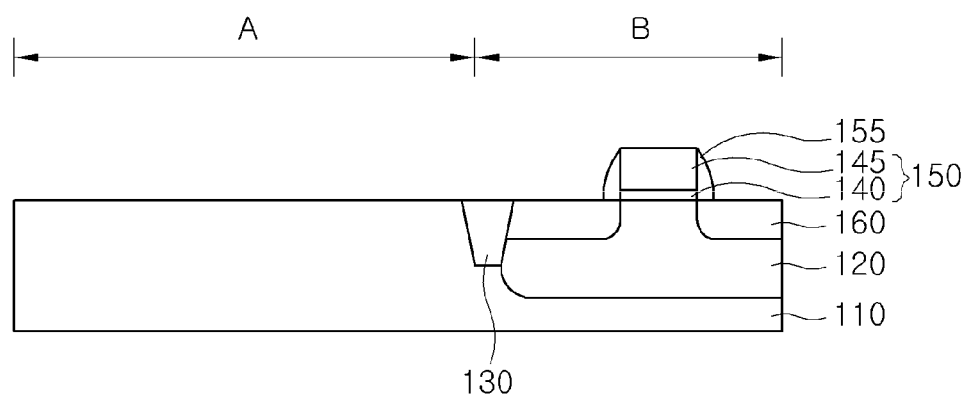

Referring to FIG. 1c, a low-resistance element, e.g., transistor is formed in the low-resistance region B. A process of forming the transistor will be described. A gate insulating layer 140 and a conductive layer 145 are formed on the low-resistance region B of the high-resistance silicon wafer 110. The gate insulating layer 140 may be formed of oxide or nitride to have a single or multiple layer structure. The conductive layer 145 may be formed of poly-silicon, tungsten or the like to have a single or multiple layer structure. A hard mask layer (not shown) may be further formed on the conductive layer 145. The conductive layer 145 is patterned through a photolithography process using a gate mask, thereby forming a gate electrode 150. Spacers 155 are formed on sidewalls of the gate electrode 150, and source/drain junction regions 160 are then formed on the high-resistance silicon wafer 110 at both sides of the gate electrode 150 by performing an impurity ion-implantation process. Accordingly, the transistor having the gate electrode 150 and the source/drain junction regions 160 is manufactured.

Figure 1D:
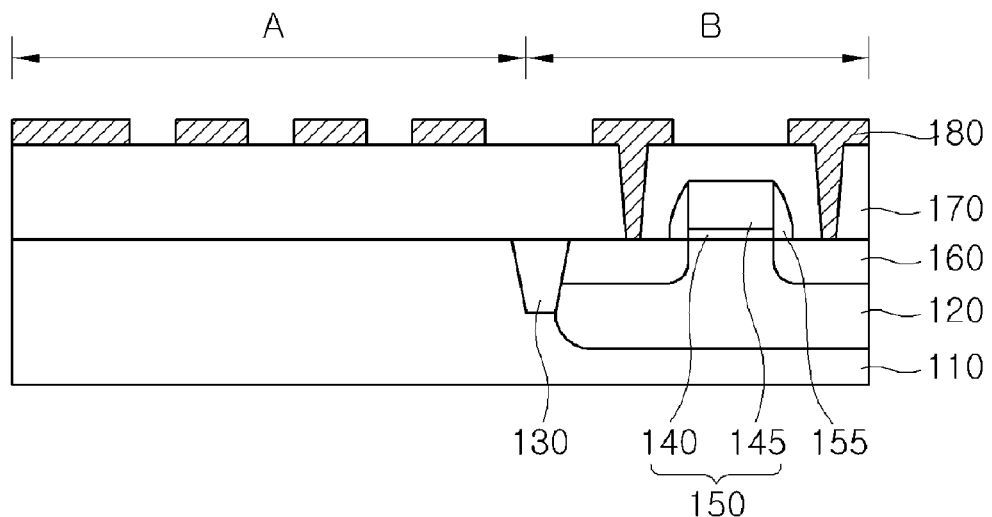

Referring to FIG. 1d, a first interlayer dielectric layer 170 is formed on the entire structure. The first interlayer dielectric layer 170 is formed of tetraethyl orthosilicate (TEOS), for example. Contact holes exposing the source/drain junction region 160 of the low-resistance region B are formed by etching a predetermined region of the first interlayer dielectric layer 170. A metal layer is formed on the entire structure to fill the contact holes and then patterned, thereby forming metal wires 180. The metal wires 180 are formed of aluminum or tungsten, for example.

Figure 1E:
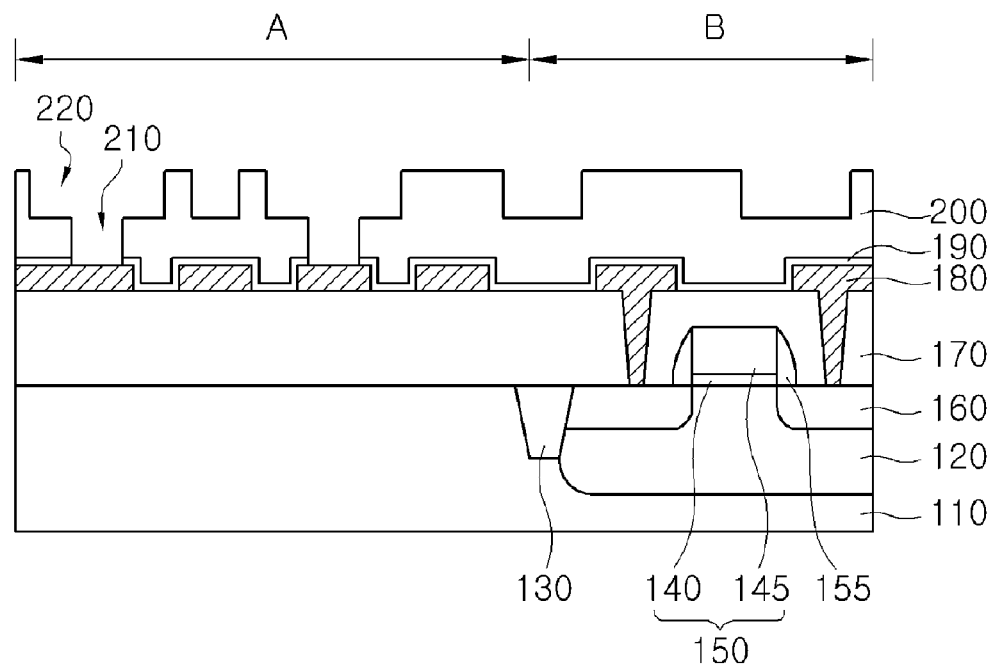

Referring to FIG. 1e, a nitride layer 190 is formed to be thin over the metal wires 180, and a second interlayer dielectric layer 200 is then formed on the entire structure. The nitride layer 190 is formed to improve the adhesion of the second interlayer dielectric layer 200. The second interlayer dielectric layer 200 is formed of a polyimide-based material including benzo cyclo butene (BCB). Via holes 210 and trenches 220 are formed by etching a predetermined region of the second interlayer dielectric layer 200. The via hole 210 is formed to expose a portion of the metal wire 180 of the high-resistance region A, and the trench 220 is partially connected to the via hole 210 and formed in a circular or polygonal spiral shape on a plane. In order to form the via holes 210 and the trenches 220 in the second interlayer dielectric layer 200 as described above, the second interlayer dielectric layer 200 is formed by laminating a first insulating layer, an etch stop layer and a second insulating layer. For example, the via holes 210 and the trenches 220 may be formed by performing an etching process using a via hole mask until the etch stop layer is exposed and then performing an etching process using a trench mask.

Figure 1F:
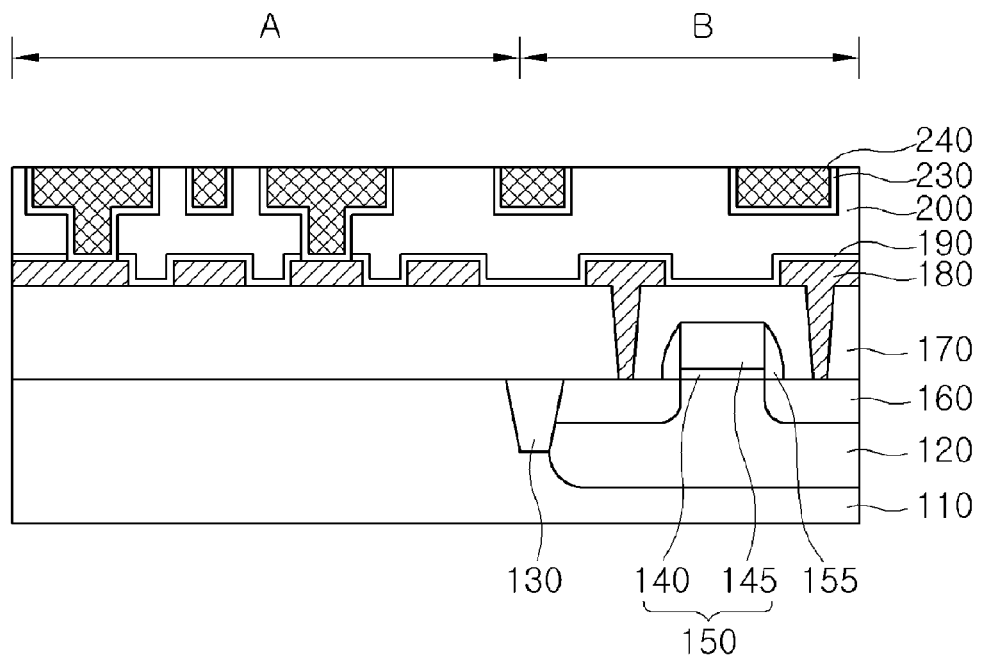

Referring to FIG. 1f, a diffusion barrier layer 230 is formed on the entire structure, a seed layer (not shown) is formed thereon, and a copper layer 240 is then formed thereon. For example, the diffusion barrier layer 230 is formed of TiW, and the copper layer is formed by an electroplating technique. The second interlayer dielectric layer 200 is exposed by polishing the copper layer 240. Accordingly, an inductor having a circular or polygonal spiral shape is formed. For example, the inductor so formed is connected to at least one of an RFIPD, an isolator, a transformer, a filter, a diplexer, a balance to unbalance transformer (balun), a coupler and an antenna.

FIG. 2 is a sectional view of a semiconductor device according to a second embodiment of the present invention. Here, the descriptions overlapping with the first embodiment described with reference to FIG. 1 will be omitted, and only the descriptions different from the first embodiment will be described.

Referring to FIG. 2, an ion implantation process is performed in a predetermined region on a high-resistance silicon wafer 110, and a diffusion region 320 is formed by performing a heat treatment process. The diffusion region 320, which is to form a low-resistance element, causes high- and low-resistance regions A and B to be defined. The diffusion region 320 may be formed in a predetermined line shape having a predetermined width. To this end, a photoresist pattern (not shown) having a predetermined line shape is formed on the high-resistance silicon 110, and an ion implantation process is then performed. Resistance is changed depending on the length, width and ion-implantation amount of the diffusion region 320. For example, if the length, width and ion-implantation amount of the diffusion region 320 are increased, the resistance is decreased, whereas if the length, width and ion-implantation amount of the diffusion region 320 are decreased, the resistance is increased. Thus, the length, width and ion-implantation amount of the diffusion region 320 are controlled depending on a desired resistance. A first interlayer dielectric layer 170 is formed on the high-resistance silicon wafer 110 having the diffusion region 320, and contact holes exposing portions of the diffusion region 320 are then formed by etching a predetermined region of the first interlayer dielectric layer 170. A conductive layer 180 is formed to fill the contact holes and then patterned, thereby forming metal wires 180. Accordingly, a resistor having wires connected to the diffusion region 320 having a predetermined resistance is manufactured. Subsequent processes will be omitted because of being the same as those of FIG. 1.

FIG. 3 is a sectional view of a semiconductor device according to a third embodiment of the present invention. Here, the descriptions overlapping with the first embodiment described with reference to FIG. 1 will be omitted, and only the descriptions different from the first embodiment will be described.

Referring to FIG. 3, an ion implantation process is performed on a high-resistance silicon wafer 110, and a diffusion region 420 is formed by performing a heat treatment process. The diffusion region 420 serves as a lower electrode of a capacitor, and a high-resistance region A and a low-resistance region B are defined by the diffusion region 420. The isolation layer 130 is formed on the high-resistance silicon wafer 110 between the high-resistance region A and the low-resistance region B. A dielectric layer 430 is formed on the high-resistance silicon wafer 110 of the low-resistance region B, and then, a conductive layer 440, e.g., a poly-silicon layer or the like is formed on the dielectric layer 430. The conductive layer 440 and the dielectric layer 430 are patterned to expose a predetermined region of the diffusion region 420, thereby forming an upper electrode. The conductive layer 440 overlaps with the diffusion region 420 and may be formed to be smaller than the diffusion region 420. A first interlayer dielectric layer 170 is formed on the entire structure, and contact holes exposing predetermined regions of the diffusion region 420 and the conductive layer 440 are formed in the first interlayer dielectric layer 170. A metal layer is formed to fill the contact hole and then patterned, thereby forming metal wires 180. Accordingly, a capacitor, in which the diffusion region 420 serving as a lower electrode, the dielectric layer 430 and the conductive layer 440 serving as an upper electrode are laminated, is manufactured. Subsequent processes will be omitted because of being the same as those of FIG. 1.

FIG. 4 is a sectional view of a semiconductor device according to a fourth embodiment of the present invention. Here, the descriptions overlapping with the first embodiment described with reference to FIG. 1 will be omitted, and only the descriptions different from the first embodiment will be described.

Referring to FIG. 4, a first diffusion region 520 is formed at a predetermined region on a high-resistance silicon wafer 110 by performing a first impurity ion-implantation process on the high-resistance silicon wafer 110. A second diffusion region 530 surrounding the first diffusion region 520 is formed by performing a second impurity ion implantation process. Here, the first and second diffusion regions 520 and 530 are formed by ion-implanting different types of impurities. That is, when the first diffusion region 520 is formed by ion-implanting an n-type impurity, the second diffusion region 530 is formed by ion-implanting a p-type impurity. On the other hand, if the first diffusion region 520 is formed by ion-implanting a p-type impurity, the second diffusion region 530 is formed by ion-implanting an n-type impurity. The first and second diffusion regions 520 and 530 so formed become first and second electrodes, respectively. A first interlayer dielectric layer 170 is formed on the entire structure, and then, contact holes exposing predetermined regions of the first and second diffusion regions 520 and 530 are respectively formed by etching a predetermined region of the first interlayer dielectric layer 170. A metal layer is formed to fill the contact holes and then patterned, thereby forming metal wires 180. Accordingly, a diode, which has first and second electrodes respectively formed in the first and second diffusion regions 520 and 530 and wires for connecting the first and second electrodes, is manufactured. Subsequent processes will be omitted because of being the same as those of FIG. 1.

As described above, according to the present invention, a high-resistance silicon wafer is manufactured in such a manner that a large-sized silicon wafer manufactured by the Czochralski method is irradiated with neutrons, and high-resistance and low-resistance elements are simultaneously formed on the high-resistance silicon wafer, so that the manufacturing cost can be remarkably saved and the reliability of products can be enhanced.

What is claimed is:

1. A device comprising:
a high-resistance substrate having first and second regions;
a low-resistance active region disposed in the second region of the high resistance substrate;
a high-resistance element in the first region of the substrates; and
a low-resistance element in the low-resistance active region in the second region of the high-resistance substrate.

2. The device of claim 1 comprises a semiconductor device.

3. The device of claim 1 wherein the low-resistance element is formed on an impurity ion implanted region formed in the low-resistance active region of the second region of the substrate.

4. The device of claim 1 wherein the substrate comprises neutron irradiated substrate.

5. The device of claim 1 wherein the substrate has a resistance of 10 kΩ-cm or more.

6. The device of claim 1 wherein the low-resistance element comprises a transistor, a resistor, a capacitor, or a diode or a combination thereof.

7. The device of claim 1 wherein the high-resistance element comprises a radio frequency integrated passive device (RFIPD), an isolator, a transformer, a filter, a diplexer, a balance to unbalance transformer (balun), a coupler or an antenna or a combination thereof.

8. A semiconductor device comprising:
a high-resistance substrate having a first and a second regions, wherein the first region comprises an impurity ion implanted region which is electrically isolated from the second region, the impurity ion implanted region defining a low-resistance active region of the high-resistance substrate;
a low-resistance element on the impurity ion implanted region of the first region;

a wire on an interlayer dielectric layer, wherein the wire is connected to the low-resistance element through the interlayer dielectric layer; and
a high-resistance element on the second region, wherein the high-resistance element is connected to the wire.

9. The semiconductor device of claim 8 wherein the substrate is manufactured by irradiating neutrons onto a silicon wafer fabricated by a Czochralski method.

10. The semiconductor device of claim 8 wherein the substrate has a resistance of 10 kΩ-cm or more.

11. The semiconductor device of claim 10 wherein the resistance of the substrate is adjustable according to the amount and irradiation time of neutrons.

12. The semiconductor device of claim 8 wherein the low-resistance element comprises a transistor, a resistor, a capacitor or a diode or a combination thereof.

13. The semiconductor device of claim 8 wherein the high-resistance element comprises a radio frequency integrated passive device (RFIPD), an isolator, a transformer, a filter, a diplexer, a balance to unbalance transformer (balun), a coupler or an antenna or a combination thereof.

14. The semiconductor device of claim 8 further comprising an inductor formed between the wire and the high-resistance element.

15. The device of claim 5 wherein the resistance of the substrate is adjustable according to the amount and irradiation time of neutrons.

16. A device comprising:
a high-resistance substrate having a first and a second regions, the first region comprises an impurity ion implanted region which is electrically isolated from the second region, the impurity ion implanted region defining a low-resistance active region of the high-resistance substrate;
a low-resistance element on the impurity ion implanted region of the first region;
a wire on a first interlayer dielectric layer, the wire is connected to the low-resistance element through the first interlayer dielectric layer;
an inductor on the second region, the inductor is formed in a second interlayer dielectric layer, wherein the inductor is connected to the wire; and
a high-resistance element on the second region, the high-resistance element is connected to the inductor.

17. The device of claim 16 wherein the high-resistance substrate comprises neutron-irradiated substrate.

18. The device of claim 16 wherein the high-resistance substrate has a resistance of 10 kΩ-cm or more.

19. The device of claim 16 wherein the low-resistance element comprises a transistor, a resistor, a capacitor, or a diode or a combination thereof.

20. The semiconductor device of claim 16 wherein the high-resistance element comprises a radio frequency integrated passive device (RFIPD), an isolator, a transformer, a filter, a diplexer, a balance to unbalance transformer (balun), a coupler or an antenna or a combination thereof.

21. A device comprising:
a substrate with a first and second region;
an ion-implanted impurity in the first region of a high-resistance substrate;
a low-resistance element formed on the first region of the substrate;
a first interlayer dielectric layer on the substrate over the low-resistance element;
a contact hole in the first interlayer dielectric layer to expose a predetermined region of the low-resistance element;

a gate insulating layer formed on the low-resistance element of the substrate, the gate insulating layer comprising oxide or nitride;
a conductive layer formed on the low-resistance element of the substrate, the conductive layer comprising poly-silicon or tungsten;
a first wire in the first interlayer dielectric layer, the first wire connected to the low-resistance element by the contact hole;
a second interlayer dielectric layer over the first interlayer dielectric layer;
a via hole and a trench formed in the second interlayer dielectric layer, wherein the via hole exposes a predetermined region of the first wire and the trench comprises a predetermined shape;
an inductor formed by the conductive layer wherein the inductor fills the via hole and the trench; and
a high-resistance element connected to the inductor.

* * * * *